United States Patent
Choi (10) Patent No.: US 9,871,218 B2
(45) Date of Patent: Jan. 16, 2018

(54) ORGANIC LIGHT EMITTING DISPLAY INCLUDING COLOR-ADJUSTING LAYER AND MANUFACTURING METHOD THEREOF

(71) Applicant: Samsung Display Co. Ltd., Yongin, Gyeonggi-Do (KR)

(72) Inventor: Sung Jin Choi, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/697,340

(22) Filed: Apr. 27, 2015

(65) Prior Publication Data
US 2016/0197297 A1 Jul. 7, 2016

(30) Foreign Application Priority Data
Jan. 5, 2015 (KR) .................. 10-2015-0000582

(51) Int. Cl.
| | |
|---|---|
| H01L 29/08 | (2006.01) |
| H01L 51/50 | (2006.01) |
| H01L 51/56 | (2006.01) |
| H01L 51/00 | (2006.01) |
| H01L 27/32 | (2006.01) |

(52) U.S. Cl.
CPC ........ H01L 51/504 (2013.01); H01L 51/5036 (2013.01); H01L 51/5068 (2013.01); *H01L 27/3209* (2013.01); *H01L 51/0037* (2013.01); *H01L 51/56* (2013.01)

(58) Field of Classification Search
CPC ............... H01L 51/504; H01L 51/5056; H01L 51/5072; H01L 51/5206; H01L 51/5221; H01L 51/56

USPC .......................................................... 257/40
See application file for complete search history.

(56) References Cited

U.S. PATENT DOCUMENTS

| | | | | |
|---|---|---|---|---|
| 2005/0221121 A1* | 10/2005 | Ishihara | .............. | H01L 51/5036 428/690 |
| 2008/0224605 A1* | 9/2008 | Noh | .................... | H01L 51/5265 313/504 |
| 2008/0231177 A1* | 9/2008 | Nomura | ................. | C09K 11/06 313/504 |
| 2012/0256216 A1* | 10/2012 | Weng | .................. | H01L 51/5203 257/98 |
| 2014/0167016 A1* | 6/2014 | Yoo | ..................... | H01L 51/5028 257/40 |

(Continued)

FOREIGN PATENT DOCUMENTS

| | | |
|---|---|---|
| KR | 10-2009-0092698 A | 9/2009 |
| KR | 10-2012-0119100 A | 10/2012 |
| KR | 10-2013-0014251 A | 2/2013 |

*Primary Examiner* — Matthew Gordon
(74) *Attorney, Agent, or Firm* — Knobbe Martens Olson & Bear LLP (57) ABSTRACT

Provided are organic light emitting display and manufacturing method of the organic light emitting display. According to an aspect of the present invention, there is provided a organic light emitting display comprising a substrate, a first electrode and a second electrode disposed on the substrate and opposed to each other, at least one organic light emitting layer positioned between the first electrode and the second electrode, and at least one color adjusting layer positioned between the organic light emitting layer and the second electrode.

14 Claims, 6 Drawing Sheets

(56) References Cited

U.S. PATENT DOCUMENTS

2015/0349284 A1* 12/2015 Seo .................... H01L 51/5016
257/40

* cited by examiner

ORGANIC LIGHT EMITTING DISPLAY INCLUDING COLOR-ADJUSTING LAYER AND MANUFACTURING METHOD THEREOF

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of Korean Patent Application No. 10-2015-0000582 filed on Jan. 5, 2015 in the Korean Intellectual Property Office, the disclosure of which is incorporated herein by reference in its entirety.

BACKGROUND

Field

The present disclosure relates to an organic light emitting display and a manufacturing method thereof.

Description of the Related Technology

Organic light emitting displays have been recently used in small mobile devices such as smart phones and have been applied to large scale televisions (TVs) having a large area screen.

Organic light emitting displays may be self-light emitting type displays displaying images by organic light emitting devices emitting light. Organic light emitting displays may be configured in such a manner that holes and electrons are injected by a first electrode and a second electrode and the injected holes and electrons are combined with each other in a light emitting layer positioned between the first electrode and the second electrode to thereby generate light using energy generated when excitons formed due to the electron-hole combination drop from an exited state to a ground state.

Organic light emitting devices may include a hole injecting layer, a hole transporting layer, an electron injecting layer, an electron transporting layer and the like, as well as an organic light emitting layer between an anode and a cathode.

Meanwhile, among such organic light emitting devices, an organic light emitting device emitting white light may generally refer to a white organic light-emitting device (WOLEDs).

SUMMARY

Some embodiments provide an organic light emitting display capable of easily adjusting a color of light emitted from an organic light emitting display element.

In addition, some embodiments may also provide a manufacturing method of the organic light emitting display.

According to an exemplary embodiment, there is provided an organic light emitting display comprising a substrate, a first electrode and a second electrode disposed on the substrate and opposed to each other, at least one organic light emitting layer positioned between the first electrode and the second electrode, and at least one color adjusting layer positioned between the organic light emitting layer and the second electrode.

In another embodiment, there is provided an organic light emitting display comprising a substrate, a first electrode and a second electrode disposed on the substrate and opposed to each other, an organic light emitting layer positioned between the first electrode and the second electrode and including at least one first organic light emitting layer emitting first color light, at least one second organic light emitting layer emitting second color light, and at least one third organic light emitting layer emitting third color light, and a color adjusting layer disposed on at least one of the first to third organic light emitting layers.

According to an embodiment, there is provided a manufacturing method of an organic light emitting display, comprising forming a first electrode on a substrate, forming at least one organic light emitting layer on the first electrode, forming a color adjusting layer on an organic light emitting layer, forming an electron-transporting layer on the color adjusting layer, and forming a second electrode on the electron-transporting layer.

Aspects of the present disclosure should not be limited by the above description, and other unmentioned aspects will be clearly understood by a person having ordinary skill in the art from example embodiments described herein.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF CERTAIN INVENTIVE EMBODIMENTS

The aspects and features of the present disclosure and methods for achieving the aspects and features will be apparent by referring to the embodiments to be described in detail with reference to the accompanying drawings. However, the present disclosure is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the disclosure, and the present disclosure is only defined within the scope of the appended claims. In the entire description of the present disclosure, the same reference numerals are used for the same elements across various figures. In the drawings, sizes and relative sizes of layers and areas may be exaggerated for clarity in explanation.

The term "on" that is used to designate that an element is on another element located on a different layer or a layer includes both a case where an element is located directly on another element or a layer and a case where an element is located on another element via another layer or still another element.

Although the terms "first, second, and so forth" are used to describe diverse constituent elements, such constituent elements are not limited by the terms. The terms are used only to discriminate a constituent element from another constituent element. Accordingly, in the following description, a first constituent element may be a second constituent element.

Hereinafter, embodiments of the present disclosure will be described with reference to the accompanying drawings.

Figure 1:
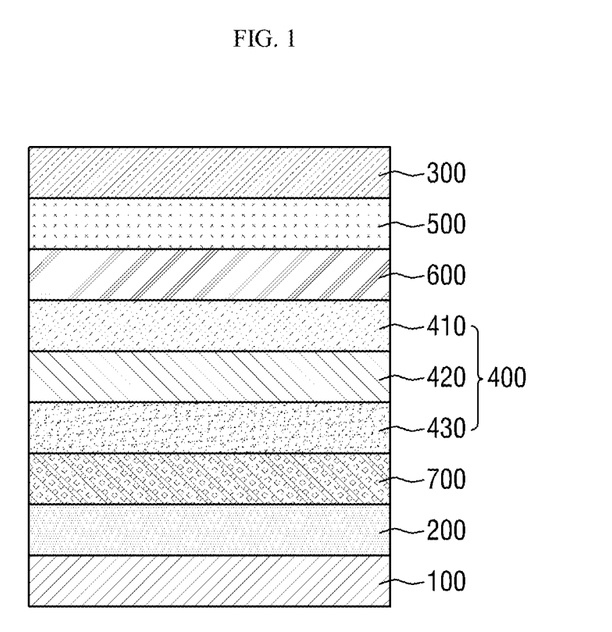
FIG. 1 is a schematic cross-sectional view of an organic light emitting display according to an exemplary embodiment.

FIG. 1 is a schematic cross-sectional view of an organic light emitting display according to an exemplary embodiment of the present disclosure.

Referring to FIG. 1, the organic light emitting display according to an exemplary embodiment may include a substrate 100, a first electrode 200 and a second electrode 300 disposed on the substrate 100 to be opposed to each other, and at least one organic light emitting layer 400 positioned between the first electrode 200 and the second electrode 300. In addition, the organic light emitting display may include at least one color adjusting layer 600 positioned between the organic light emitting layer 400 and the second electrode 300.

The substrate 100 may include an insulating substrate. In the case that the organic light emitting display is a front-light emitting type device, the insulating substrate may be a transparent substrate, a translucent substrate or an opaque substrate.

The insulating substrate may be formed of glass, quartz, a polymer resin or the like. Examples of the polymer material may include polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (CAT or TAC), and cellulose acetate propionate (CAP) or combinations thereof. In some exemplary embodiments, the insulating substrate may be a flexible substrate formed of a flexible material such as polyimide (PI).

Although not illustrated in the exemplary embodiment, the substrate 100 may further include other structures disposed on the insulating substrate. Examples of the other structures may include, a wiring, an electrode, an insulating layer and the like. In some exemplary embodiments, the substrate 100 may include a plurality of thin film transistors disposed on the insulating substrate. A drain electrode of at least a portion of the plurality of thin film transistors may be electrically connected to the first electrode 200. The thin film transistors may include an active region formed of amorphous silicon, polycrystalline silicon, monocrystalline silicon or the like. In another exemplary embodiment of the present disclosure, the thin film transistors may include an active region formed of an oxide semiconductor.

The first electrode 200 may be positioned on the substrate 100 and be disposed in each pixel area of the organic light emitting display. The first electrode 200 may be an anode and contain a conductive material having a relatively large work function as compared to that of the second electrode 300. For example, the first electrode 200 may contain an indium-tin-oxide (ITO), an indium-zinc-oxide (IZO), a zinc oxide (ZnO), an indium oxide (In$_2$O$_3$), or the like. The examples of the conductive material exemplified as above may have a relatively large work function and transparent characteristics.

In addition to the conductive material exemplified as above, the first electrode 200 may further contain a reflective material, for example, silver (Ag), magnesium (Mg), aluminum (Al), platinum (Pt), lead (Pd), gold (Au), nickel (Ni), neodymium (Nd), iridium (Ir), chrome (Cr), lithium (Li), calcium (Ca), or combinations thereof. Thus, the first electrode 200 has a single layer structure formed of the conductive material and the reflective material as exemplified above or a multilayer structure formed by stacking the respective layers. For example, the first electrode 200 may have a multilayer structure including layers of ITO/Mg, ITO/MgF, ITO/Ag, and ITO/Ag/ITO, but is not limited thereto.

The second electrode 300 may be a cathode and may also be a front electrode or a common electrode formed without distinction of pixels. The second electrode 300 may contain a conductive material having a relatively low work function as compared to the first electrode 200.

The second electrode 300 may contain Li, Ca, LiF/Ca, LiF/Al, Al, Mg, Ag, Pt, Pd, Ni, Au Nd, Ir, Cr, BaF, Ba or compounds or combinations thereof (for example, a combination of Ag and Mg and the like). The second electrode 300 may further include an auxiliary electrode. The auxiliary electrode may include a film formed through the deposition of the said material and a transparent metal oxide formed on the film, for example, an indium-tin-oxide (ITO), an indium-zinc-oxide (IZO), a zinc oxide (ZnO), an indium-tin-zinc-oxide, manganese dioxide (MnO$_2$) or the like.

The second electrode 300 may be formed by forming a conductive layer having a relatively low work function as a thin film and then, stacking a transparent conductive layer, for example, an indium-tin-oxide (ITO) layer, an indium-zinc-oxide (IZO) layer, a zinc oxide (ZnO) layer, an indium oxide layer (In$_2$O$_3$), or the like, on the conductive layer.

As described above, the second electrode 300 is formed of a transparent conductive material, whereby light generated from the organic light emitting layer 400 may pass through the second electrode 300 and be emitted through a front surface of the second electrode 300. Accordingly, a front-light emitting type organic light emitting display may be implemented, but is not limited thereto.

The color adjusting layer 600 may contain a first material having a high electron transport capability and a second material having a high hole transport capability. The color adjusting layer 600 may contain the first material and the second material as described above, such that a light emitting zone of light provided from a lower portion of the color adjusting layer 600 may be moved. Accordingly, the light emitting zone may be moved without any operation such as an operation of separately changing a thickness of the organic light emitting device, such that the color of light may be easily changed to a desired color.

More specifically, the amounts of the first material and the second material within the color adjusting layer 600 may be adjusted, whereby the light emitting zone may be changed. Accordingly, the amounts of constituents contained in the first material and the second material may be adjusted, light having a desired color may be adjusted to be emitted.

The first material refers to a material having a high electron transport capability, that is, a material having a degree of mobility of electrons relatively higher than that of holes and easily providing the electrons. In an exemplary embodiment, the first material may include matter configuring an electron-transporting layer to be described later. In addition to the matter configuring the electron-transporting layer, the first material may include the matter having a high degree of mobility of electrons among materials configuring the organic light emitting layer 400.

The second material refers to a material having a high hole transport capability, that is, a material having a degree of mobility of holes relatively higher than that of electrons and easily providing the holes. In an exemplary embodiment, the second material may include matter configuring a hole-transporting layer to be described later, but is not limited thereto. In addition to the matter configuring the hole-transporting layer, the second material may include the matter having a high degree of mobility of holes among materials configuring the organic light emitting layer 400.

Meanwhile, the organic light emitting display may further include an electron-transporting layer 500 between the color adjusting layer 600 and the second electrode 300, the electron-transporting layer 500 transferring electrons to the organic light emitting layer 400. In an exemplary embodiment, examples of the electron-transporting layer 500 may include Alq3 (tris-(8-hydroyquinolato) aluminum(III)), TPBi (1,3,5-tris(N-phenylbenzimiazole-2-yl)benzene), BCP (2,9-dimethyl-4,7-diphenyl-1,10-phenanthroline), Bphen (4,7-diphenyl-1,10-phenanthroline), TAZ (3-(Biphenyl-4-yl)-5-(4-tert-butylphenyl)-4-phenyl-4H-1,2,4-triazole), NTAZ (4-(naphthalen-1-yl)-3,5-diphenyl-4H-1,2,4-triazole), tBu-PBD (2-(4-biphenylyl)-5-(4-tert-butyl-phenyl)-1,3,4-oxadiazole), BAlq (Bis(2-methyl-8-quinolinolato-N1,O8)-(1,1'-Biphenyl-4-olato)aluminum), Bebq2 (Bis(10-hydroxybenzo[h]quinolinato)beryllium), ADN (9,10-bis(2-naphthyl)anthracene), and combinations thereof, but are not limited thereto. As described above, the first material having a high degree of mobility of electrons may include the materials configuring the electron-transporting layer 500.

Meanwhile, the organic light emitting display may further include a hole-transporting layer 700 between the organic light emitting layer 400 and the first electrode 200, the hole-transporting layer 700 transferring electric charges to the organic light emitting layer 400. In the event that the highest occupied molecular orbital (HOMO) of the hole-transporting layer 700 is substantially lower than a work function of the material configuring the first electrode 300 and is substantially higher than the highest occupied molecular orbital (HOMO) of the organic light emitting layer 400, the efficiency of transferring holes may be optimized. For example, examples of the hole-transporting layer 700 may include NPD (4,4'-bis[N-(1-napthyl)-N-phenyl-amino]biphenyl), TPD (N,N'-diphenyl-N,N'-bis[3-methyl-phenyl]-1,1'-biphenyl-4,4'-diamine), s-TAD (2,2',7,7'-tetrakis-(N,N-diphenylamino)-9,9'-spirobifluoren), m-MTDATA (4,4',4"-tris(N-3-methylphenyl-N-phenylamino)triphenylamine) and the like, but are not limited thereto. As described above, the second material having a high degree of mobility of holes may include the materials configuring the hole-transporting layer 700.

Meanwhile, the organic light emitting display may include at least one organic light emitting layer 400 including a first organic light emitting layer 410 and a second organic light emitting layer 420 formed to contact each other, the first organic light emitting layer 410 emitting first color light and the second organic light emitting layer 420 emitting second color light. The color adjusting layer 600 may be formed on an upper portion of the first organic light emitting layer 410 and the second organic light emitting layer 420 formed to contact each other. In an exemplary embodiment, the color adjusting layer 600 may be formed on the first organic light emitting layer 410, as in FIG. 1.

At least one of the first color light and the second color light may be red light or green light, and the remaining one may be green light or red light.

Referring to FIG. 1, the organic light emitting layer 400 may further include a third organic light emitting layer 430 emitting third color light, and the third organic light emitting layer 430 may be positioned between the first organic light emitting layer 410 and the second organic light emitting layer 420, and the first electrode 200. The first organic light emitting layer 410 and the second organic light emitting layer 420 may be formed to contact each other. In addition, the third color light may be blue light.

Referring to FIG. 1, In the case that the first organic light emitting layer 410 and the second organic light emitting layer 420 formed to contact each other are included, the color adjusting layer 600 may be formed between the organic light emitting layers 410 and 420 adjacent to each other, and the second electrode 300, whereby a light emitting zone of white light may be moved and accordingly, the adjustment of color may be facilitated. In this case, the organic light emitting display may be a front-light emitting type organic light emitting display.

When holes are provided from the first electrode 200 and electrons are provided from the second electrode 300, the holes and the electrons are combined with each other in the organic light emitting layer 400 positioned between the first electrode 200 and the second electrode 300, whereby light may be generated using energy generated when excitons formed due to the electron-hole combination drop from an exited state to a ground state.

In an exemplary embodiment, the organic light emitting layer 400 may include a host and a dopant.

Examples of the host may include Alq3 (tris-(8-hydroyquinolato) aluminum(III)), CBP (4,4'-N,N'-dicarbazole-biphenyl), PVK (poly(N-vinylcarbazole)), (9,10-Bis(2-naphthalenyl)anthracene), TCTA (4,4',4"-tris(Ncarbazolyl)triphenylamine), TPBi (1,3,5-tris(N-phenylbenzimiazole-2-yl)benzene), TBADN (2-(t-butyl)-9, 10-bis (20-naphthyl) anthracene), DSA (distyrylarylene), CDBP (4,4'-Bis(9-carbazolyl)-2,2'-Dimethyl-biphenyl), MADN (2-Methyl-9,10-bis(naphthalen-2-yl)anthracene), and the like.

As the dopant, all of a fluorescent dopant and a phosphor dopant commonly known in the art may be used. Types of the dopant may be varied depending on the color of light emitted from the organic light emitting layer 400.

A red dopant may be selected from fluorescent materials containing PBD: Eu(DBM)3(Phen)(2-biphenyl-4-yl-5-(4-t-butylphenyl)-1,3,4-oxadiazole:Tris(dibenzoylmethane) mono(1,10-phenanthroline)europium(111)) or perylene, for example. In this case, a phosphor material may be selected from metal complexes such as PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium) and PtOEP (octaethylporphyrin platinum), and organometallic complexes.

A green dopant may be selected from fluorescent materials containing Alq3 (tris-(8-hydroxyquinolato) aluminum (III)), for example. In this case, a phosphor material may be selected from Ir(ppy)3 (fac-tris(2-phenylpyridine)iridium), Ir(ppy)2(acac) (Bis(2-phenylpyridine)(acetylacetonate)iridium(III)), Ir(mpyp)3 (2-phenyl-4-methyl-pyridine iridium), and the like.

A blue dopant may be selected from fluorescent materials containing one selected from the group consisting of spiro-DPVBi (spiro-4,'-bis(2,2'-diphenylvinyl)1,1'-biphenyl), spiro-6P (spiro-sixphenyl), DSB (distyrylbenzene), DSA (distyrylarylene), PFO (polyfluorene) and PPV (poly p-phenylene vinylene) polymers. In this case, a phosphor material may be, for example, F2Irpic (bis[2-(4,6-difluorophenyl)pyridinato-N,C2']iridium picolinate), (F2ppy)2Ir(tmd) (bis

[2-(4,6-difluorophenyl)pyridinato-N,C2']iridium 2,2,6,6-tetramethylheptane-3,5-dione), Ir(dfppz)3 (tris[1-(4,6-difluorophenyl)pyrazolate-N,C2']iridium), or the like.

Figure 2:
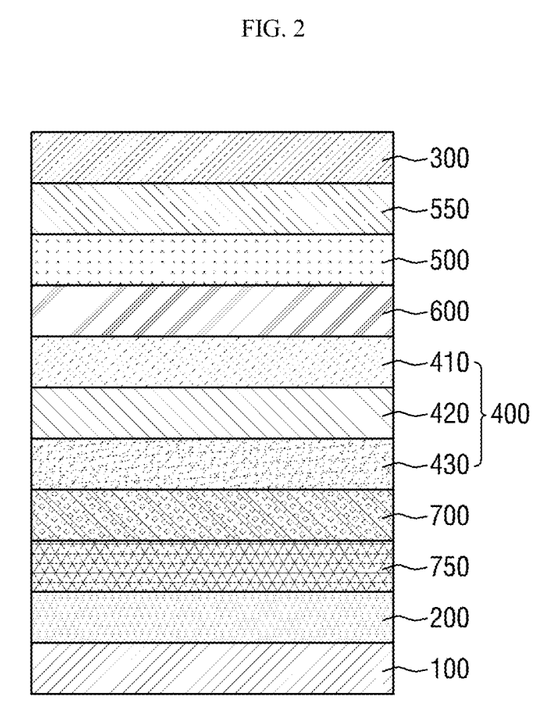
FIG. 2 is a schematic cross-sectional view of an organic light emitting display according to another exemplary embodiment.

FIG. 2 is a schematic cross-sectional view of an organic light emitting display according to another exemplary embodiment of the present disclosure.

Referring to FIG. 2, the organic light emitting display according to another exemplary embodiment of the present disclosure may further include an electron-injecting layer 550 between the electron-transporting layer 500 and the second electrode 300, the electron-injecting layer 550 injecting electrons provided from the second electrode 300 therein.

The electron-injecting layer 550 may be disposed on the electron-transporting layer 500 and serve to increase the efficiency of injecting the electrons from the second electrode 300 to the organic light emitting layer 400.

The electron-injecting layer 550 may be formed of a lanthanum-group metal such as LiF, LiQ (lithium quinolate), $Li_2O$, BaO, NaCl, CsF, or Yb, a halogenated metal such as RbCl or RbI, or the like, but is not limited thereto. The electron-injecting layer 550 may also be formed of a material in which the said material is mixed with an organo metal salt having insulating properties. The organo metal salt that may be used may be a material having an energy band gap of approximately 4 eV or greater. Specifically, the organo metal salt may include metal acetate, metal benzoate, metal acetoacetate, metal acetylacetonate or metal stearate.

In addition, the organic light emitting display according to another exemplary embodiment of the present disclosure may further include a hole-injecting layer 750 between the hole-transporting layer 700 and the first electrode 200, the hole-injecting layer 750 injecting holes provided from the first electrode 200 into a light emitting layer.

The hole-injecting layer 750 may be disposed on the first electrode 200 and serve to increase the efficiency of injecting the holes from the first electrode 200 to the organic light emitting layer 400. Specifically, the hole-injecting layer 750 may lower an energy barrier and allow for further effective injection of the holes.

The hole-injecting layer 750 may contain a phthalocyanine compound such as copper phthalocyanine (CuPc), m-MTDATA (4,4',4"-tris(N-3-methylphenyl-N-phenylamino)triphenylamine), TDATA (4,4',4"-tris(diphenylamino)triphenylamine), 2-TNATA (4,4',4"-tris[2-naphthyl(phenyl)-amino]triphenyl-amine), Pani/DBSA (Polyaniline/Dodecylbenzenesulfonic acid), PEDOT/PSS (Poly(3,4-ethylene dioxythiophene)/Polystyrene sulfonate), PANI/CSA (Polyaniline/Camphorsulfonic acid), PANI/PSS (Polyaniline/Polystyrene sulfonate) or the like.

Figure 3:
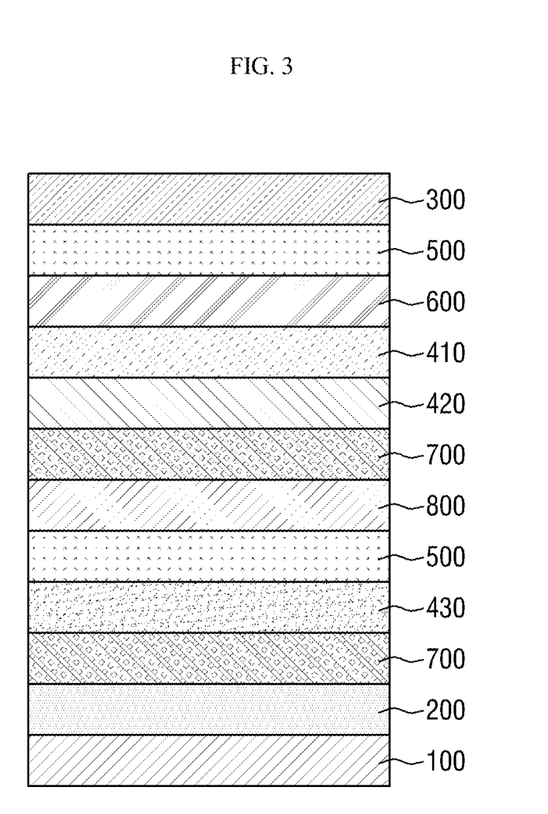
FIG. 3 is a schematic cross-sectional view of an organic light emitting display according to another exemplary embodiment.

FIG. 3 is a schematic cross-sectional view of an organic light emitting display according to another exemplary embodiment of the present disclosure.

Referring to FIG. 3, the organic light emitting display according to another exemplary embodiment of the present disclosure may further include a charge generating layer 800 positioned between the first organic light emitting layer 410 and the second organic light emitting layer 420, and the third organic light emitting layer 430. In addition, the organic light emitting display may include the hole-transporting layer 700 described as above between the charge generating layer 800 and the second electrode 300 and may further include the electron-transporting layer 500 between the charge generating layer 800 and the first electrode 200, more specifically, between the charge generating layer 800 and the third organic light emitting layer 430.

The charge generating layer 800 may include an n-type charge generation layer and a p-type charge generation layer.

The p-type charge generation layer may generate holes and electrons and may inject the generated holes into the first and second organic light emitting layers 410 and 420 adjacent thereto and positioned thereabove and inject the generated electrons into the n-type charge generation layer to allow the electrons to be injected into the third organic light emitting layer 430 adjacent thereto and positioned therebelow. Meanwhile, since the p-type charge generation layer is widely known in the technical field, a further detailed description thereof will be omitted.

The n-type charge generation layer may inject the electrons generated from the p-type charge generation layer into the third organic light emitting layer 430 disposed therebelow. The n-type charge generation layer may be formed of the same material as that of the electron-transporting layer 500.

Figure 4:
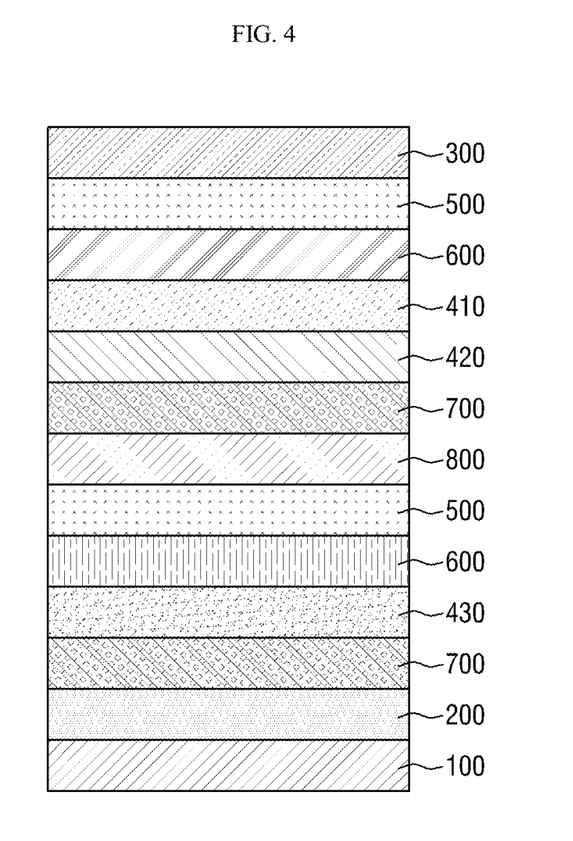
FIG. 4 is a schematic cross-sectional view of an organic light emitting display according to another exemplary embodiment.

FIG. 4 is a schematic cross-sectional view of an organic light emitting display according to another exemplary embodiment of the present disclosure.

Referring to FIG. 4, the organic light emitting display may further include a color adjusting layer 600 on the third organic light emitting layer 430. In this case, the amounts of the first material and the second material contained in each of the color adjusting layer 600 formed on the third organic light emitting layer 430 and the color adjusting layer 600 formed between the first organic light emitting layer 410 and the electron-transporting layer 500 may be adjusted to move a light emitting zone of finally emitted white light, thereby allowing for the emission of light having a desired color.

That is, the organic light emitting display according to another exemplary embodiment of the present disclosure may include the substrate 100, the first electrode 200 and the second electrode 300 disposed to be opposed to each other on the substrate 100, an organic light emitting layer 400 positioned between the first electrode 200 and the second electrode 300 and including at least one first organic light emitting layer 410 emitting first color light, at least one second organic light emitting layer 420 emitting second color light, and at least one third organic light emitting layer 430 emitting third color light, and the color adjusting layer 600 disposed on at least one of the first to third organic light emitting layers 410 to 430.

Meanwhile, other components according to the exemplary embodiment are described above, and accordingly, an overlapped explanation thereof will be omitted.

Figure 5:
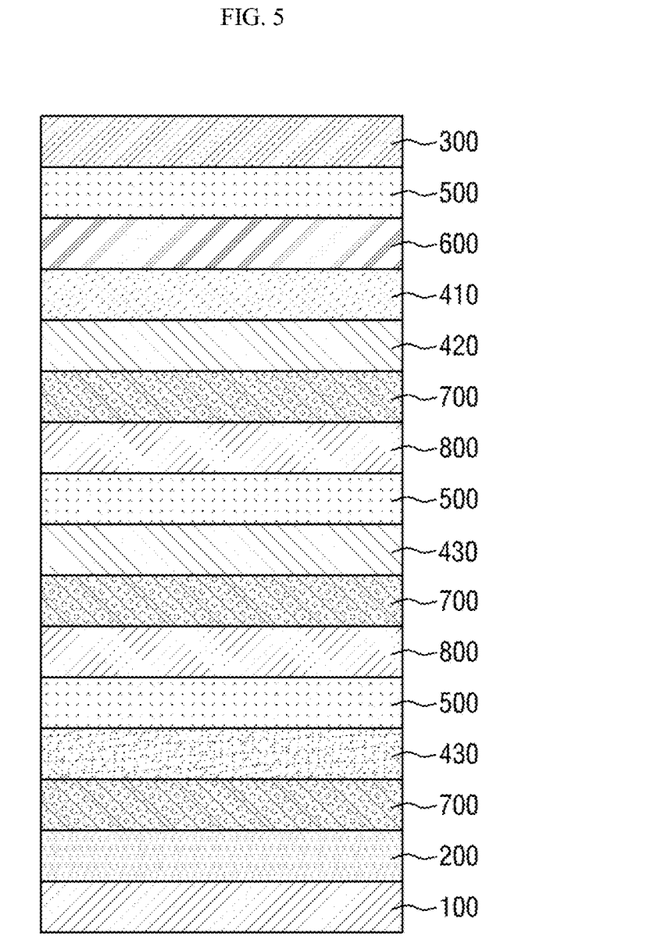
FIG. 5 is a schematic cross-sectional view of an organic light emitting display according to another exemplary embodiment.

FIG. 5 is a schematic cross-sectional view of an organic light emitting display according to another exemplary embodiment of the present disclosure.

Referring to FIG. 5, the organic light emitting display may include two or more third organic light emitting layers 430 emitting blue light and in this case, the third organic light emitting layers 430 may be formed to be spaced apart from each other, and the hole-transporting layer 700, the charge generating layer 800 and an electron-transporting layer 500 may be interposed between the third organic light emitting layers 430.

Meanwhile, other components according to the exemplary embodiment are described above, and accordingly, an overlapped explanation thereof will be omitted.

Figure 6:
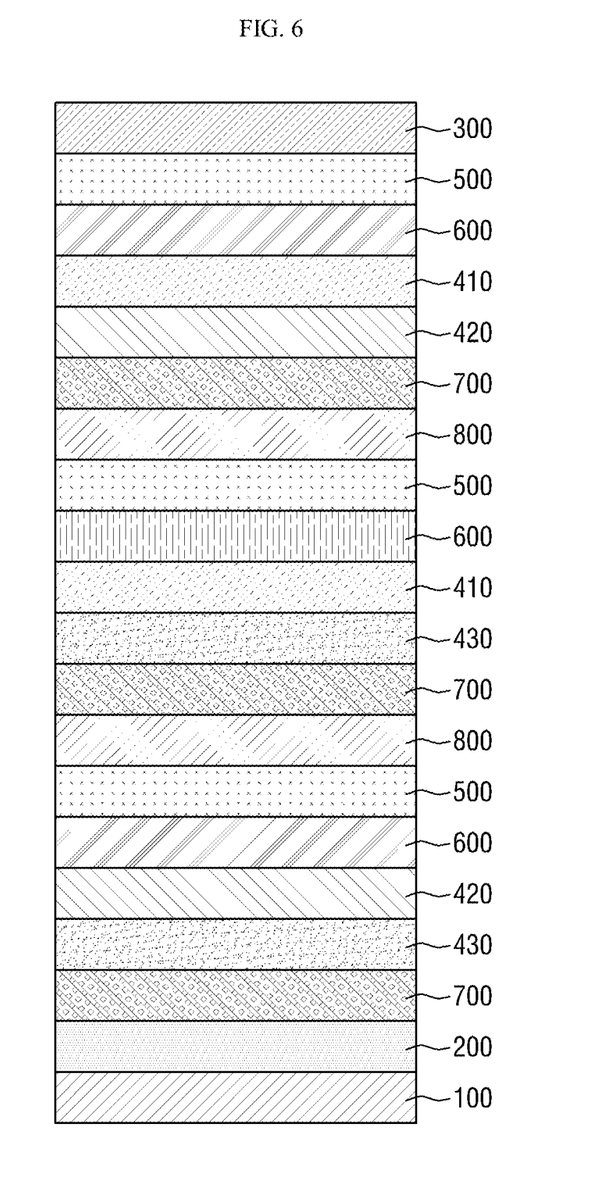
FIG. 6 is a schematic cross-sectional view of an organic light emitting display according to another exemplary embodiment.

FIG. 6 is a schematic cross-sectional view of an organic light emitting display according to another exemplary embodiment of the present disclosure.

Referring to FIG. 6, the organic light emitting display may include a plurality of first organic light emitting layers 410 emitting red light, a plurality of second organic light emitting layers 420 emitting green light, and a plurality of third organic light emitting layers 430 in order to finally emit while light.

In addition, when the organic light emitting layers are disposed to be spaced apart from one another, the charge generating layers 800, the hole-transporting layers 700, and the electron-transporting layers 500 may be formed between the organic light emitting layers.

More specifically, the organic light emitting display may have the second electrode 300, the first organic light emitting layer 410 and the second organic light emitting layer 420 adjacent to the second electrode 300 and formed to contact each other, the first organic light emitting layer 410 and the third organic light emitting layer 430 spaced apart from the first and second organic light emitting layers and formed to contact each other, the second organic light emitting layer 420 and the third organic light emitting layer 430 spaced apart from the first and third organic light emitting layers and formed to contact each other, and the first electrode 200 that are sequentially formed therein as in FIG. 6.

In addition, the color adjusting layer 600 may be formed on the organic light emitting layers respectively adjacent to each other, and the electron-transporting layer 500 may be formed on the color adjusting layer 600.

Meanwhile, the organic light emitting displays according to the present disclosure are not limited to those of the foregoing exemplary embodiments and if necessary, may include an increased amount of organic light emitting layers.

Although not illustrated, an exemplary embodiment of the present disclosure may provide a manufacturing method of the organic light emitting display and hereinafter, the manufacturing method of the organic light emitting display will be explained.

The manufacturing method of the organic light emitting display may include: forming the first electrode on the substrate; forming at least one organic light emitting layer on the first electrode; forming the color adjusting layer on the organic light emitting layer; forming the electron-transporting layer on the color adjusting layer; and forming the second electrode on the electron-transporting layer.

Meanwhile, since descriptions of the organic light emitting layer, the color adjusting layer, the electron-transporting layer and the like are already provided with reference to the organic light emitting display, an overlapped description will be omitted.

Further, the manufacturing method of the organic light emitting display may further include: at least one of forming at least one of the hole-injecting layer and the hole-transporting layer supplying the holes generated from the first electrode to the organic light emitting layer between the first electrode and the organic light emitting layer; and forming at least one of the electron-injecting layer and the electron-transporting layer supplying the electrons generated from the second electrode to the organic light emitting layer between the second electrode and the organic light emitting layer. Since descriptions of the hole-transporting layer, the hole-injecting layer, the electron-transporting layer and the electron-injecting layer are already provided with reference to the organic light emitting display, a further detailed description thereof will be omitted.

The respective elements configuring the organic light emitting display as described above may be formed by, for example, using a slit nozzle or a scheme of ejecting ink within a pixel area defined by a partition using an inkjet printing method. In addition to these, the respective elements configuring the organic light emitting display may be formed by a method commonly performed in the technical field, such as a deposition method or a sputtering method. The methods are widely known in the technical field and a further detailed description thereof will be omitted.

As set forth above, according to exemplary embodiments of the present disclosure, an organic light emitting display capable of easily adjusting a color of light emitted from an organic light emitting display element and a manufacturing method thereof may be provided.

Effects according to the exemplary embodiments of the present disclosure are not limited to the description exemplified as above, and further various effects may be included within the specification.

While exemplary embodiments have been shown and described above, it will be apparent to those skilled in the art that modifications and variations could be made without departing from the spirit and scope of the present disclosure as defined by the appended claims.

What is claimed is:

1. An organic light emitting display, comprising:
   a substrate;
   a first electrode and a second electrode disposed on the substrate and opposed to each other;
   at least one organic light emitting layer positioned between the first electrode and the second electrode;
   wherein the at least one organic light emitting layer includes first and second organic light emitting layers formed to contact each other, the first organic light emitting layer emitting first color light, and the second organic light emitting layer emitting second color light;
   at least one color adjusting layer contacting the organic light emitting layer; and
   the color adjusting layer is positioned on the first organic light emitting layer or the second organic light emitting layer; and
   the color adjusting layer is positioned between the organic light emitting layer and the second electrode; and
   an electron transporting layer disposed between the at least one color adjusting layer and the second electrode,
   wherein the at least one color adjusting layer contains a first material having a high electron transport capability and a second material having a high hole transport capability.

2. The organic light emitting display of claim 1, wherein the first material has a degree of mobility of electrons higher than a degree of mobility of holes.

3. The organic light emitting display of claim 1, wherein the second material has a degree of mobility of holes higher than a degree of mobility of electrons.

4. The organic light emitting display of claim 1, wherein the first electrode is an anode and the second electrode is a cathode.

5. The organic light emitting display of claim 1, wherein the at least one organic light emitting layer further includes a third organic light emitting layer emitting third color light, and
   the third organic light emitting layer is positioned between the second organic light emitting layer and the first electrode.

6. The organic light emitting display of claim 5, wherein the third color light is blue light.

7. The organic light emitting display of claim 5, further comprising: a charge generating layer positioned between the first and second organic light emitting layers and the third organic light emitting layer.

8. The organic light emitting display of claim 5, wherein one of the at least one color adjusting layer is positioned on the third organic light emitting layer.

9. An organic light emitting display comprising:
a substrate;
a first electrode and a second electrode disposed on the substrate and opposed to each other;
an organic light emitting layer positioned between the first electrode and the second electrode and including at least one first organic light emitting layer emitting first color light, at least one second organic light emitting layer emitting second color light, and at least one third organic light emitting layer emitting third color light; wherein the third color light is blue light;
the first organic light emitting layer and the second organic light emitting layer are positioned to contact each other;
a color adjusting layer contacting at least one of the first to third organic light emitting layers;
the color adjusting layer is positioned between the first organic light emitting layer and the second electrode; and
an electron transporting layer disposed between the color adjusting layer and the second electrode,
wherein the color adjusting layer contains a first material having a high electron transport capability and a second material having a high hole transport capability.

10. A manufacturing method of an organic light emitting display, comprising:
forming a first electrode on a substrate;
forming at least one organic light emitting layer on the first electrode;
forming a color adjusting layer on the at least one organic light emitting layer;
forming an electron-transporting layer directly on the color adjusting layer; and
forming a second electrode on the electron-transporting layer; and
wherein the color adjusting layer contains a first material having a high electron transport capability and a second material having a high hole transport capability;
wherein the at least one organic light emitting layer includes first and second organic light emitting layers formed to contact each other, the first organic light emitting layer emitting first color light, and the second organic light emitting layer emitting second color light; and
wherein the color adjusting layer is positioned on the first organic light emitting layer or the second organic light emitting layer.

11. The manufacturing method of claim 10, wherein the first material has a degree of mobility of electrons higher than a degree of mobility of holes.

12. The manufacturing method of claim 10, wherein the second material has a degree of mobility of holes higher than a degree of mobility of electrons.

13. The manufacturing method of claim 10, further comprising: at least one of forming at least one of a hole-injecting layer and a hole-transporting layer supplying holes generated from the first electrode to the organic light emitting layer between the first electrode and the organic light emitting layer; and forming at least one of an electron-injecting layer and an electron-transporting layer supplying electrons generated from the second electrode to the organic light emitting layer between the second electrode and the organic light emitting layer.

14. An organic light emitting display comprising:
a substrate;
a first electrode and a second electrode disposed on the substrate and opposed to each other;
at least one organic light emitting layer positioned between the first electrode and the second electrode;
at least one color adjusting layer positioned between the organic light emitting layer and the second electrode; and
an electron transporting layer comprising a first surface and a second surface opposing the first surface,
wherein the first surface contacts the second electrode and the second surface contacts the at least one color adjusting layer, and
wherein the at least one color adjusting layer contains a first material having a high electron transport capability and a second material having a high hole transport capability.

* * * * *